United States Patent
Buer (10) Patent No.: US 9,922,212 B2
(45) Date of Patent: *Mar. 20, 2018

(54) COMPACT HIGH LINEARITY MMIC BASED FET RESISTIVE MIXER

(71) Applicant: ViaSat, Inc., Carlsbad, CA (US)

(72) Inventor: Kenneth V. Buer, Gilbert, AZ (US)

(73) Assignee: VIASAT, INC., Carlsbad, CA (US)

( * ) Notice: Subject to any disclaimer, the term of this patent is extended or adjusted under 35 U.S.C. 154(b) by 55 days.

This patent is subject to a terminal disclaimer.

(21) Appl. No.: 13/783,589

(22) Filed: Mar. 4, 2013

(65) Prior Publication Data

US 2013/0176067 A1 Jul. 11, 2013

Related U.S. Application Data

(63) Continuation of application No. 12/756,955, filed on Apr. 8, 2010, now Pat. No. 8,401,512.

(51) Int. Cl.
*G06G 7/16* (2006.01)
*H04B 1/26* (2006.01)
*H03D 7/14* (2006.01)

(52) U.S. Cl.
CPC ............ *G06G 7/16* (2013.01); *H03D 7/1433* (2013.01); *H03D 7/1441* (2013.01); *H03D 7/1458* (2013.01); *H03D 7/1466* (2013.01); *H03D 2200/0088* (2013.01)

(58) Field of Classification Search
CPC ...... H04B 1/26; H03D 7/1441; H03D 7/1458; H03D 7/1433; H03D 7/1466; H03D 2200/0088; G06G 7/16
USPC .......... 455/333, 189.1, 190.1, 323–326, 329, 455/313–319, 128, 127.5, 127.1, 209, 455/126, 188.1; 330/129, 286, 306, 295; 333/24.2, 29.2, 245–247, 260; 343/700 MS, 841, 883, 701–705; 331/108 C, 117 D, 117 FE, 172, 177 R; 257/699

See application file for complete search history.

(56) References Cited

U.S. PATENT DOCUMENTS

| | | |
|---|---|---|
| 2,026,286 A | 2/2000 | Long |
| 6,026,287 A | 2/2000 | Puechberty et al. |
| 6,091,312 A | 7/2000 | Sheen |
| 6,163,877 A * | 12/2000 | Gupta ............................ 716/55 |
| 6,539,216 B1 | 3/2003 | Oh et al. |
| 6,590,438 B1 | 7/2003 | Manku et al. |

(Continued)

FOREIGN PATENT DOCUMENTS

| | | |
|---|---|---|
| TW | 200501609 | 1/2005 |
| TW | 200828783 | 7/2008 |
| TW | I548206 | 9/2016 |

OTHER PUBLICATIONS

USPTO; Office Action dated Nov. 6, 2012 in U.S. Appl. No. 12/756,964.

(Continued)

*Primary Examiner* — Pablo Tran
(74) *Attorney, Agent, or Firm* — Snell & Wilmer L.L.P.

(57) ABSTRACT

A MMIC (microwave monolithic integrated circuit) based FET mixer and method for the same is provided. In particular, adjacent transistors, such as FETs (field effect transistors) share terminals reducing physical layout separation and interconnections. A smaller die size is realized with the improved system geometry herein provided.

19 Claims, 6 Drawing Sheets

(56) References Cited

U.S. PATENT DOCUMENTS

| | | | |
|---|---|---|---|
| 6,653,885 B2* | 11/2003 | Wu et al. | 327/356 |
| 6,654,604 B2 | 11/2003 | Yokogawa et al. | |
| 6,879,192 B2* | 4/2005 | Merenda | 327/113 |
| 6,933,766 B2 | 8/2005 | Khlat et al. | |
| 7,079,829 B2 | 7/2006 | Nakatani et al. | |
| 7,085,548 B1 | 8/2006 | Kluge et al. | |
| 7,248,120 B2* | 7/2007 | Burgener et al. | 330/311 |
| 7,266,357 B2* | 9/2007 | Behzad | 455/285 |
| 7,403,761 B2 | 7/2008 | Ashby et al. | |
| 7,435,664 B2 | 10/2008 | Lu et al. | |
| 7,580,693 B2 | 8/2009 | Rohde et al. | |
| 7,672,647 B2 | 3/2010 | Forstner et al. | |
| 7,729,672 B2 | 6/2010 | Deng et al. | |
| 7,962,114 B2 | 6/2011 | Garcia et al. | |
| 7,991,368 B2 | 8/2011 | Rubin et al. | |
| 8,018,267 B2 | 9/2011 | Kang et al. | |
| 8,112,059 B2* | 2/2012 | Beffa | 455/326 |
| 8,115,307 B2 | 2/2012 | Toyama et al. | |
| 8,139,674 B2 | 3/2012 | Jaso | |
| 8,149,955 B2 | 4/2012 | Tired | |
| 8,249,541 B2 | 8/2012 | Bao et al. | |
| 2001/0046849 A1* | 11/2001 | Villemazet et al. | 455/326 |
| 2002/0102951 A1 | 8/2002 | Nakano et al. | |
| 2006/0160500 A1 | 7/2006 | Ammar | |
| 2009/0111394 A1 | 4/2009 | Vajha et al. | |
| 2010/0327940 A1* | 12/2010 | Eisenstadt et al. | 327/357 |
| 2011/0009084 A1 | 1/2011 | Papananos | |
| 2012/0229217 A1 | 9/2012 | Kawano et al. | |

OTHER PUBLICATIONS

USPTO; Office Action dated Oct. 16, 2012 in U.S. Appl. No. 12/756,955.

USPTO; Notice of Allowance dated Nov. 26, 2012 in U.S. Appl. No. 12/756,955.

USPTO; Supplemental Notice of Allowability dated Feb. 14, 2013 in U.S. Appl. No. 12/756,955.

Office Action and Search Report mailed in Taiwanese Patent Application No. 100108069 dated Jun. 5, 2015, 11 pgs., including English translation.

Office Action and Search Report mailed in Taiwanese Patent Application No. 100108069 dated Apr. 12, 2016, 14 pgs., including English translation.

Notice of Allowance mailed in Taiwanese Patent Application No. 100108069 dated Jun. 30, 2016, 2 pgs.

* cited by examiner

COMPACT HIGH LINEARITY MMIC BASED FET RESISTIVE MIXER

CROSS-REFERENCE TO RELATED APPLICATIONS

This application is a continuation application of application Ser. No. 12/756,955, titled "COMPACT HIGH LINEARITY MMIC BASED FET RESISTIVE MIXER" filed Apr. 8, 2010, which is fully incorporated herein by reference for any reason.

FIELD OF INVENTION

The present invention relates generally to resistive mixers. More particularly, the application relates to an improved monolithic microwave integrated circuit (MMIC) FET resistive mixer.

BACKGROUND OF THE INVENTION

Mixers may be frequency translation devices. Mixers may allow the down and/or up conversion of signals from a high frequency (generally radio frequency (RF)) to a lower frequency (generally intermediate frequency (IF) or baseband) or vice versa. In communication systems, the RF may be the transmission frequency, which may be converted to an IF to allow improved selectivity (filtering) and an easier implementation of low noise and high gain amplification.

Figure 1:
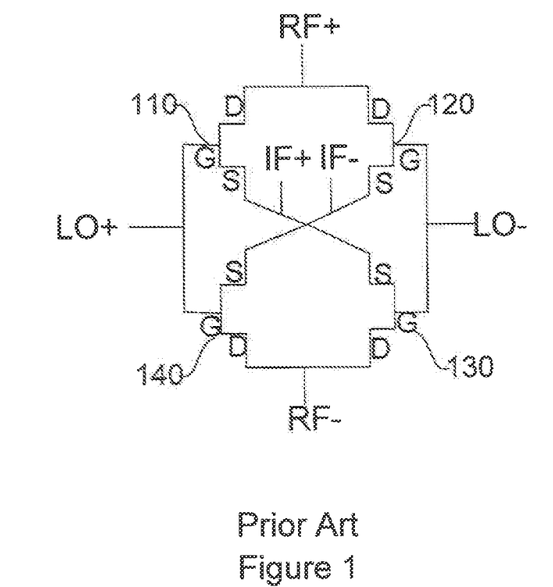
FIG. 1 illustrates a prior art FET ring.

Referring to FIG. 1, a conventional double balanced FET ring is depicted. Ring double-balanced mixers may be described by treating the ring double-balanced mixer non-linear components (diodes, BJTs or FETs) as switches, which are turned "on" and "off" by the local oscillator (LO). This approach assumes that the conductance waveform of the FET is a square wave, which is approximately true, as long as the LO power level is above a certain level and the LO's frequency is below a certain level, For instance, the LO power may be about 20 dBm (100 mW). The LO signal is configured to switch FETs 110 and 130 on and off in anti-phase with FETs 120 and 140. The RF signal and a 180 degree shifted version of the RF signal may be alternatively routed through to the IF port. The IF output is effectively the RE signal multiplied by a LO square wave of peak magnitude +/−1. Compared to diode mixers, FET mixers have better. P1 dB compression point performances. Also, compared to diode mixers, FET mixers have lower intermodulation distortion products and lower spurious signals due to higher linearity.

However, this approach, if implemented within a semiconductor device, requires a great deal of real estate on the die. Larger dies associated with the greater space demand increase the chances for imperfections within the die. In the traditional embodiment of FIG. 1, there are 6 interconnect lines coupling the RF+ signal, RF− signal, LO+ signal, LO− signal, RF− signal and RF+ signal to the system. Due to the physical separation of the 4 FETs these interconnect line lengths are longer than if the multiple FETs were located closer together or portions of the multiple FETs were removed. For instance, there are four total gates, four total sources, and four total drains. Each FET requires a conduit or coupling which introduces opportunities for losses and parasitic capacitances and discontinuities that may limit high frequency performance. As the frequency is increased the parasitic capacitance and distributed inductance from the interconnects introduce phase errors between the signals causing imperfect cancellation of spurious products from the balanced mixer configuration and higher loss. Also, larger MMIC die are more expensive as cost is approximately proportional to die size. Thus, smaller MMIC die size is more desirable because of reduced cost. Also, smaller MMIC die size is desirable due to improved high frequency performance.

Accordingly, there exists a need for a compact high linearity MMIC based mixer that reduces the die size. In addition, there is a need for a lower cost compact high linearity MMIC based mixer.

SUMMARY OF THE INVENTION

In one exemplary embodiment, a semiconductor device includes a plurality of three terminal semiconductor portions housed on a single substrate. In one exemplary embodiment each three terminal semiconductor portion further comprises a source terminal, a drain terminal, and a gate terminal; a LO+ signal is coupled to a first gate terminal, wherein the first gate terminal is coupled to a first source terminal and a first drain terminal; a LO+ signal is coupled to a third gate terminal, wherein the third gate terminal is coupled to a second source terminal and a second drain terminal; a LO− signal is coupled to a second gate terminal wherein the second gate terminal is coupled to the first drain terminal and the second source terminal; a LO− signal is coupled to a fourth gate terminal wherein the fourth gate terminal is coupled to the second drain terminal and a third source terminal; a RF+ signal is coupled to the first drain terminal; a RF− signal is coupled to the second drain terminal; an IF+ signal is coupled to the first source terminal and the third source terminal; and an IF− signal is coupled to the second source terminal. In one exemplary embodiment, the first source terminal and the third source terminal are coupled together. In one exemplary embodiment, the first gate terminal and the third gate terminal are coupled together. In one exemplary embodiment, the second gate terminal and the fourth gate terminal are coupled together. In one exemplary embodiment, at least one of the source terminal, drain terminal and gate terminal are shared among a plurality of adjacent three terminal semiconductor portions.

In one exemplary embodiment, a semiconductor device may include a microwave monolithic integrated circuit based field effect transistor quad ring mixer comprising a first field effect transistor, a second field effect transistor, a third field effect transistor, and a fourth field effect transistor. In one exemplary embodiment, there are no wirebonds coupling the first field effect transistor, the second field effect transistor, the third field effect transistor, and the fourth field effect transistor together.

In one exemplary embodiment, a semiconductor device may include a microwave monolithic integrated circuit based field effect transistor quad ring mixer. In one exemplary embodiment, the quad ring mixer includes four field effect transistors. In one exemplary embodiment, the quad ring mixer comprises a reduction of (e.g. no more than 3) total interconnect line lengths coupling signals to portions of the system.

In one exemplary embodiment, a semiconductor device may include, a plurality of three terminal semiconductor portions housed on a single substrate, wherein each three terminal semiconductor portion further comprises a source terminal, a drain terminal, and a gate terminal; a LO+ signal is coupled to a first subset of the plurality of gate terminals; a LO− signal is coupled to a second subset of the plurality of gate terminals; a RF+ signal is coupled to a first subset of the plurality of drain terminals; a RF− signal is coupled to a second subset of the plurality of drain terminals; an IF+ signal is coupled to a first subset of the plurality of source terminals; and an IF− signal is coupled to a second subset of the plurality of source terminals. In one exemplary embodiment, the first subset of the plurality of source terminals may be coupled together. In one exemplary embodiment, the first subset of the plurality of gate terminals may be coupled together. In one exemplary embodiment, the second subset of the plurality of gate terminals may be coupled together. In one exemplary embodiment, at least one of the source terminal, drain terminal and gate terminal may be shared among a plurality of adjacent three terminal semiconductor portions.

In one exemplary embodiment, a semiconductor device includes four three terminal semiconductor portions housed on a single substrate. In one exemplary embodiment, the surface area of the semiconductor device is less than approximately 0.0075 mm$^2$.

BRIEF DESCRIPTION OF THE DRAWINGS

These and other features, aspects and advantages of the present invention will become better understood with reference to the following description, appending claims, and accompanying drawings where:

DETAILED DESCRIPTION OF EXEMPLARY EMBODIMENTS

While exemplary embodiments are described herein in sufficient detail to enable those skilled in the art to practice the invention, it should be understood that other embodiments may be realized and that logical material, electrical, and mechanical changes may be made without departing from the spirit and scope of the invention. Thus, the following detailed description is presented for purposes of illustration only.

The present invention relates to an improved resistive mixer and more particularly, to an improved monolithic microwave integrated circuit (MMIC) based FET resistive mixer. A MMIC is a type of integrated circuit (IC) device that operates at microwave frequencies (300 MHz to 300 GHz). Although the resistive mixer disclosed herein may be suitable in a variety of applications, the present invention may be conveniently described with reference to commercial satellites systems or terrestrial point to multi point communication systems, radars, and more particularly to ground based Ka-band transmitters operating between about 26.5 GHz and 32 GHz. In addition, reference is made to a FET (field effect transistor) mixer; however, it should be appreciated and understood by one skilled in the art that various other transistors may appropriately be used in the present invention, for example, bipolar junction transistors (BJTs), MOSFETs, MESFETs, diode, HEMT (high electron mobility transistors), and/or heterojunction bipolar transistors (HBTs). Similarly, reference is made to a source, drain and gate of the FET mixer, however, it should be appreciated and understood by one skilled in the art that various other reference may be made in place of source, drain and gate (such as emitter, collector, and base, or an input and an output). Additionally, it should be appreciated and understood by one skilled in the art that a two terminal device, such as a diode, may be substituted for any three terminal device disclosed herein. Generally, two signals, such as the IF frequency signal and the RF frequency signal, may be diplexed as desired as would be appreciated and understood by one skilled in the art. Additionally, physically a source may be operated as a drain and an associated drain may be operated as a source.

Figure 2:
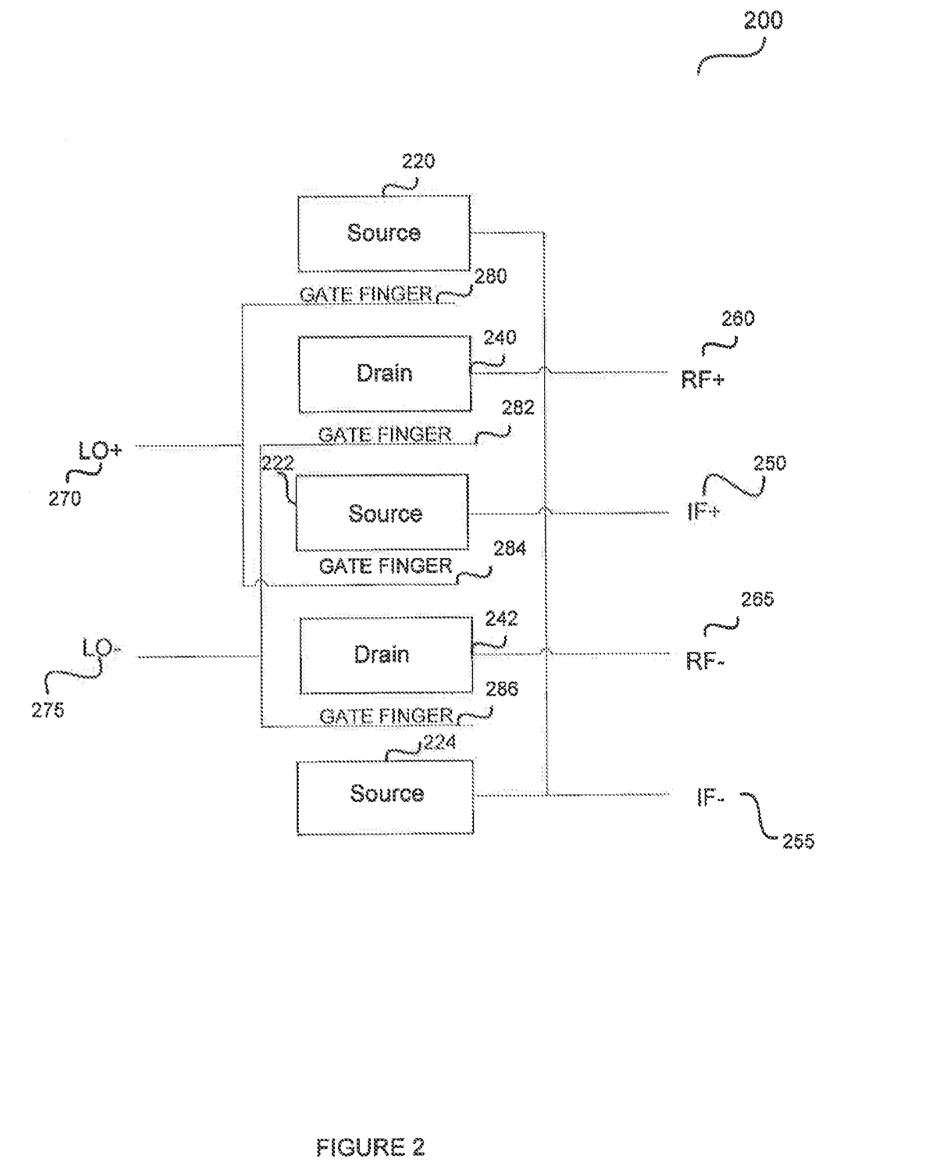
FIG. 2 illustrates an exemplary system configuration in accordance with the present invention.

Referring now to FIG. 2, an exemplary MMIC implemented PET resistive mixer 200 is illustrated. In this orientation, the components of adjacent FETs (e.g. source and/or drain) may be "shared." Though only a single FET cell (of 4 FET fingers) layout is depicted in FIG. 2, for higher linearity, multiple PET cells or additional FET fingers may be utilized if desired (See FIG. 3). The improved FET geometry of the present invention may provide many benefits over the prior art, for example, reduced die size, increased reliability, reduction in area (reduction in area results in a proportional reduction in parasitic capacitance), reduction of parasitic capacitance, reduction of interconnect inductance and improved performance, the details of which will be discussed below.

Referring again to FIG. 2, in an exemplary embodiment, FET resistive mixer 200 is configured to avoid the need for "dead" space utilized for interconnect routing and physical separation in the conventional layout. For instance, such as the interconnect routing required to couple signals to the terminals of the prior art. In an exemplary embodiment, the FET resistive mixer 200 is configured to have a separation of about 15 to 30 microns between two gates. In an exemplary embodiment, the longest interconnect line length of the PET resistive mixer 200 is configured to have an interconnect line length of 100 microns or less. For instance, the IF− signal interconnect line length (i.e. to a plurality of sources) may be 100 microns or less.

MMIC based FET resistive mixer 200 may be fabricated on any suitable MMIC substrate (i.e., chip, die) of a suitable semiconductor material such as silicon (Si), gallium arsenide (GaAs), germanium (Ge), organic polymers, indium phosphide (InP), and combinations such as mixed silicon and germanium (e.g. SiGe), mixed silicon and carbon, or any semiconductor substrate suitable for fabricating devices capable of operating as a switch.

Figure 3:
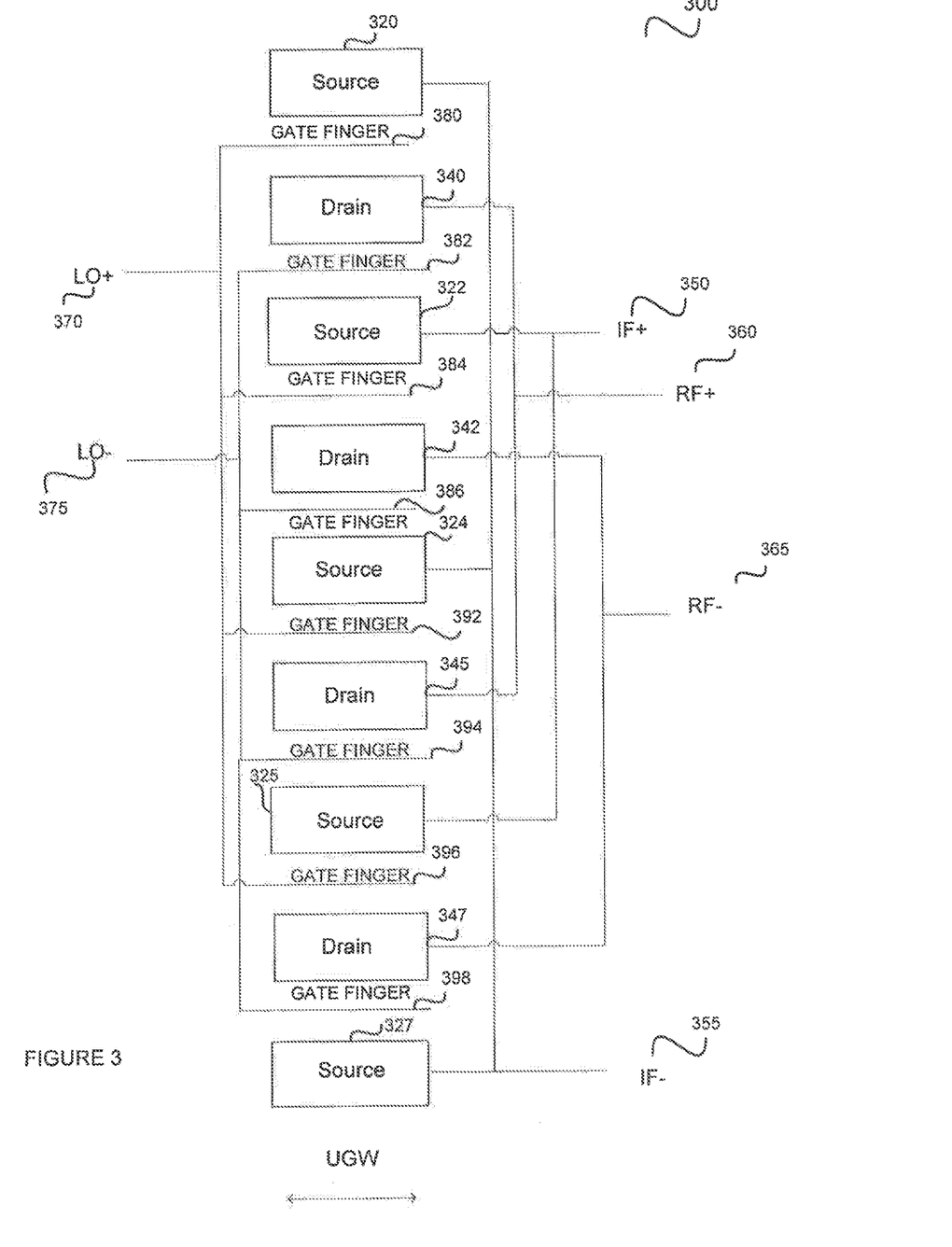
FIG. 3 illustrates an exemplary MMIC based FET resistive mixer system configuration.

The exemplary embodiments shown in FIGS. 2-3 are suitable for any microwave and millimeter frequency range. If a typical frequency around 30 GHz is chosen, the length of the FET resistive mixer 200, in accordance with the present invention, is approximately 100 um and the width is approximately 75 um. In an exemplary embodiment, the surface area of the MMIC chip is approximately 0.0075 mm$^2$. In an exemplary embodiment, the MMIC chip comprises one of a 1-ml, a 2 mil, a 4 mil, or an 8 mil die. In contrast, a conventional FET ring with similar performance characteristics (e.g., FET ring 100) if implemented on a semiconductor, requires a die size of approximately 215 um length and 225 um width. For instance, in an exemplary embodiment, the space required for a conventional quad FET ring (e.g, FET ring 100) is more than six times the space required for the MMIC based FET resistive mixer 200. In an exemplary embodiment, MMIC based FET resistive mixer 200 is configured to provide a more compact layout than conventional layouts (e.g. FET ring 100). Higher yields may result from this more compact layout due to less chance of imperfections on the die.

The reduced die size of the present invention provides easier handling and assembly of the die. For example, in the past, the relatively thin 2-mil die (i.e., 50 µm) was extremely susceptible to breakage, and as the die area increased, the chance of breakage increased. Moreover, smaller die area decreases the probability of random die defects within the die itself and reduces the chance of solder voids in the attach process. One skilled in the art will readily recognize the benefits of the reduced die size provided by the present invention including, but not limited to, the improved production yield. Some of the advantages of various exemplary embodiments are herein described with respect to a 2-mil die, for among the same and other reasons, it should be appreciated that other die sizes (e.g., 1-mil, 4-mil, 8-mil, and the like) are equally advantageous.

In an exemplary embodiment, the MMIC based FET resistive mixer 200 includes a plurality of three terminal semiconductor portions on a single substrate. The three terminal semiconductor portions, in one exemplary embodiment, may be configured as field effect transistors (FETs). In this exemplary embodiment, the FETs may include a source terminal, a drain terminal and a gate terminal. The three terminal semiconductor portions may be built upon a MMIC substrate. In an exemplary embodiment, at least one of the source terminal, drain terminal and gate terminal may be coupled to at least one input of a LO+ signal, a LO− signal, an IF+ signal, an IF− signal, a RF+ signal, and a RF− signal. In one exemplary embodiment, as shown in FIG. 2, at least one of the source terminal, drain terminal, and gate terminal of the plurality of FETs may be directly coupled to at least one input of the IF+ signal, RF+ signal, and RF− signal with reduced interconnects, and thus a reduction of interconnect line lengths, between the plurality of FETs.

In an exemplary embodiment, MMIC based FET resistive mixer 200 has six signal input terminals. In an exemplary embodiment, referring to FIG. 2, at least one LO+ signal input 270 is coupled to a first subset (e.g, 280, 284) of the plurality of gate terminals (e.g, 280, 282, 284, 286). In an exemplary embodiment, a LO− 275 signal input is coupled to a second subset (e.g. 282, 286) of the plurality of gate terminals (e.g. 280, 282, 284, 286), In an exemplary embodiment, a RF+ 260 signal input is coupled to a first subset (e.g. 240) of the plurality of drain terminals (e.g, 240, 242). In an exemplary embodiment, a RF− 265 signal input is coupled to a second subset (e.g. 242) of the plurality of drain terminals (e.g. 240, 242). In an exemplary embodiment, an IF− 255 signal input is coupled to a first subset (e.g. 220, 224) of the plurality of source terminals (e.g. 220, 222, 224). In an exemplary embodiment, an IF+ 250 signal is coupled to a second subset (e.g. 222) of the plurality of source terminals (e.g. 220, 222, 224). In an exemplary embodiment, a first subset (e.g. 220, 224) of a plurality of source terminals (e.g, 220, 222, 224) are coupled together. In an exemplary embodiment, the first subset (e.g. 280, 284) of the plurality of gate terminals (e.g. 280, 282, 284, 286) may be coupled together. In an exemplary embodiment, a second subset (e.g. 282, 286) of the plurality of gate terminals (e.g. 280, 282, 284, 286) are coupled together. In an exemplary embodiment, the first subset 240 of the plurality of drain terminals (e.g. 240, 242) comprise one drain terminal (e.g. 240). In an exemplary embodiment, the second subset 242 of the plurality of drain (e.g. 240, 242) terminals comprises one drain terminal (e.g. 242).

For instance, with reference to FIG. 2, the resistive mixer 200 may include multiple three terminal semiconductor portions housed on a single substrate. In one exemplary embodiment, MMIC based FET resistive mixer 200 may include four three terminal semiconductor portions housed on a single substrate. In an exemplary embodiment, a LO+ signal input 270 is coupled to a first gate terminal 280. In an exemplary embodiment, the first gate terminal 280 may be coupled to a first source terminal 220 and a first drain terminal 240. In an exemplary embodiment, LO+ signal input 270 may be coupled to a third gate terminal 284. In an exemplary embodiment, the third gate terminal 284 may be coupled to a second source terminal 222 and a second drain terminal 242. In an exemplary embodiment, a LO− signal 275 may be coupled to a second gate terminal 282. In an exemplary embodiment, the second gate terminal 282 may be coupled to the first drain terminal 240 and the second source terminal 222. In an exemplary embodiment, LO− signal input 275 may be coupled to a fourth gate terminal 286. In an exemplary embodiment, the fourth gate terminal 286 may be coupled to the second drain terminal 242 and a third source terminal 224. In an exemplary embodiment, RF+ signal input 260 may be coupled to the first drain terminal 240. In an exemplary embodiment, signal input 265 may be coupled to the second drain terminal 242. In an exemplary embodiment, RF− signal input 255 may be coupled to the first source terminal 220 and the third source terminal 224. In an exemplary embodiment, IF+ signal input 250 may be coupled to the second source terminal 222. In an exemplary embodiment, the first source terminal 220 and the third source terminal 224 may be coupled together. In an exemplary embodiment, the first gate terminal 280 and the third gate terminal 284 may be coupled together. In an exemplary embodiment the second gate terminal 282 and the fourth gate terminal 286 may be coupled together.

In one exemplary embodiment, the couplings to the IF− signal input 255 and the IF+ signal input 250 as depicted in system 200 of FIG. 2, are reversed. For instance, in one embodiment, IF+ signal input 250 may be coupled to the first source terminal 220 and the third source terminal 224 and IF− signal input 255 may be coupled to the second source terminal 222. In one exemplary embodiment, the couplings to RF− signal input 265 and RF+ signal input 260 as depicted in system 200 of FIG. 2, are reversed. For instance, in an exemplary embodiment, RF+ signal input 260 may be coupled to the second drain terminal 242 and RF− signal input 265 may be coupled to the first drain terminal 240. In one exemplary embodiment, the couplings to LO− signal input 275 and LO+ signal input 270 as depicted in system 200 of FIG. 2, are reversed. For example, in an exemplary embodiment, a LO− signal 275 is coupled to a first gate terminal 280 and a third gate terminal 284. Also, for example, in an exemplary embodiment, LO+ signal input 270 may be coupled to a second gate terminal 282 and a fourth gate terminal 286.

In another exemplary embodiment, IF− signal input 255, RF− signal input 265, and/or LO− signal input 275 are tied to a common ground. In an exemplary embodiment, the system may be configured as single balanced mixer with IF− signal input 255, RF− signal input 265, and LO− signal input 275 fed single ended reducing half of the structure as compared with system 200.

In an exemplary embodiment, the LO is housed on the same substrate the MMIC based FET resistive mixer 200 is mounted on. In another exemplary embodiment, the LO is not housed on the same substrate the MMIC based FET resistive mixer 200 is mounted on, but a signal from the LO is coupled to the MMIC based FET resistive mixer 200. The LO may be any suitable LO providing any suitable LO frequency.

In another exemplary embodiment, the layout of MMIC based FET resistive mixer 200 is configured such that a high degree of symmetry exists in the RF and LO interconnections. Improved symmetry provides better balance and thus improved spurious performance. By arranging the layout in a way that provides the best symmetry at the highest frequency ports of the mixer, improved high frequency spurious performance is achieved. For example, with reference to FIG. 4, layout of high frequency elements (the RF+ signal input and the RF− signal input) comprise a high level of symmetry. For example, with reference to FIG. 4, layout of the next highest frequency elements (the LO+ signal input and the LO− signal input) comprise a high level of symmetry. In an exemplary embodiment of MMIC based FET resistive mixer 200, even-order spurious responses are rejected due to the symmetry of MMIC based FET resistive mixer 200.

In an exemplary embodiment, the configuration of MMIC based FET resistive mixer 200 may be substantially free from path length differences. For instance, with renewed reference to FIG. 2, the layout of MMIC based FET resistive mixer 200, may be configured to comprise fewer parasitic interconnect line lengths and other parasitic capacitances and discontinuities that may limit high frequency performance.

In one exemplary embodiment, mixer 200 may be configured to reduce parasitic capacitance. In one exemplary embodiment, mixer 200 may be configured to reduce parasitic capacitance to operate reliably at a high frequency. Interconnect parasitics may include signal delay and signal noise. Also, mixer 200 may be configured to reduce discontinuity. Discontinuities can introduce a parasitic element that affects the signal transmission. Mixer 200 may provide upconversion. The mixer may provide down conversion. Mixer 200 may be described by the equation:

$$f_{RF} = f_{LO} \pm f_{IF}.$$

In one exemplary embodiment, passive MMIC based FET resistive mixer 200 may provide good linearity performance. For instance, in one exemplary embodiment the system has a third order intercept point of about 25 dBm. The third order intercept point may be a function of LO drive and the total FET periphery used. The linearity performance of MMIC based FET resistive mixer 200, as evaluated in terms of the third-order intercept point, may be affected by variations in the load impedance. Thus, the most predictable performance may occur with a purely resistance termination as the load. This type of stable termination can be achieved by terminating the MMIC based FET resistive mixer 200 with a filter. In an exemplary embodiment, the filter may appear purely resistive within its 3-dB passband. In an exemplary embodiment, as the filter's impedance rises beyond its passband, MMIC based FET resistive mixer 200 intercept performance may degrade. Passive mixers may require higher LO power levels, but may provide better third-order intercept performance.

In another exemplary embodiment, MMIC based FET resistive mixer 200 may be configured to provide suppression of the local oscillator signal, which may otherwise saturate or seriously reduce the performances of an IF amplifier stage. In another embodiment, MMIC based FET resistive mixer 200 may be configured to provide better spurious product suppression and lower loss than the conventional FET mixer. For instance, the MMIC based FET resistive mixer 200 may provide spurious product suppression of 10-20 dB improved compared to conventional layouts. Additionally, MMIC based FET resistive mixer 200 may provide 10% lower power loss at high frequency operation as compared to conventional layouts (e.g., FET ring 100). Additionally, as higher frequencies are used in a conventional mixer interconnect parasitics cause much more loss. For instance, a conventional mixer might increase to 10-12 dB at frequencies above 20 GHz, whereas the topology of one present exemplary embodiment may be about 8-9 dB in the above 20 GHz frequency range.

In an exemplary embodiment, a Quad FET comprises 4 FETs, wherein the 4 FETs comprise a total of 3 source terminals, 2 drain terminals, and 4 gate terminals. In an exemplarily embodiment, the above Quad FET comprises 4 FETs, wherein a LO signal is coupled to gate terminals, a RF signal is coupled to drain terminals and an IF signal is coupled to source terminals. For multiple FET cells (where each Quad FET is a FET cell) the number of terminals (i.e. 3 source terminals, 2 drain terminals, and 4 gate terminals) may be doubled, tripled, etc.

In an exemplary embodiment, MMIC based FET resistive mixer 200 comprises one or more balun. A balun may be used to transform a signal between balanced and unbalanced modes. An unbalanced signal may be referenced to a ground plane. A balanced signal is typically carried on two lines and is not referenced to a ground plane. In a balanced configuration, each line can be considered as carrying an identical signal but with 180 degrees of phase difference. These baluns may be any suitable balun such as a spiral balun, wire-wound transformer, active balun, lumped element balun, and/or a printed balun.

In an exemplary embodiment, a balun may be coupled to the IF signal, the RF signal and/or the LO signal. In an exemplary embodiment, during the positive half-cycle of the LO signal to MMIC based FET resistive mixer 200, two of the FETs are in conduction while the other two are turned off. In another exemplary embodiment, a secondary winding of a RF balun may be connected to the secondary winding of an IF balun through the FETs that are switched on. During the LO signal's negative half-cycle, the FETs which were on during the positive half-cycle are turned off and vice versa. This results in a reversal of the polarity of the RF signal reaching the IF balun. The frequency at which the FETs are turned on and off may be determined by the frequency of the LO signal. In an exemplary embodiment, this may be mathematically equivalent to a multiplication of the RF and LO signals, resulting in the generation of sum and difference frequencies at the IF port.

In an exemplary embodiment, MMIC based FET resistive mixer 200 is coupled to a high power amplifier. In an exemplary embodiment, MMIC, based FET resistive mixer 200 is incorporated with a transceiver. In an exemplary embodiment, MMIC based FET resistive mixer 200 may be combined with a high power amplifier to form a single chip millimeter wave transmitter.

In another exemplary embodiment and with reference to FIG. 3, an exemplary MMIC based FET resistive mixer 300 configuration is provided. The pattern of source, drains and gates, depicted in mixer 300 is exemplary and may be extended accordingly as desired. In one exemplary embodiment, mixer 300 functions similar to mixer 200. Unit gate width (UGW) may be scaled to increase linearity. Scaling unit gate width may reduce high frequency performance in some cases.

For instance, with continued reference to FIG. 3, MMIC based FET resistive mixer 300 may include multiple three terminal semiconductor portions housed on a single substrate. In an exemplary embodiment, a LO+ signal 370 is coupled to a first gate terminal 380. In an exemplary embodiment, the first gate terminal 380 may be coupled to a first source terminal 320 and a first drain terminal 340. In an exemplary embodiment, a LO+ signal 370 may be coupled to a third gate terminal 384. in an exemplary embodiment, the third gate terminal 384 may be coupled to a second source terminal 322 and a second drain terminal 342. In an exemplary embodiment, a LO+ signal 370 may be coupled to a fifth gate terminal 392. In an exemplary embodiment, the fifth gate terminal 392 may be coupled to a third source terminal 324 and a third drain terminal 345. In an exemplary embodiment, a LO+ signal 370 may be coupled to a seventh gate terminal 396. In an exemplary embodiment, the seventh gate terminal 396 may be coupled to a fourth source terminal 325 and a fourth drain terminal 347.

In an exemplary embodiment, a LO− signal 375 may he coupled to a second gate terminal 382. In an exemplary embodiment, the second gate terminal 382 may be coupled to the first drain terminal 340 and the second source terminal 322. In an exemplary embodiment, a LO− signal 375 may be coupled to a fourth gate terminal 386. In an exemplary embodiment, the fourth gate terminal 386 may be coupled to the second drain terminal 342 and a third source terminal 324. In an exemplary embodiment, a LO− signal 375 may be coupled to a sixth gate terminal 394. In an exemplary embodiment, the sixth gate terminal 394 may be coupled to the third drain terminal 345 and the fourth source terminal 325. In an exemplary embodiment, a LO− signal 375 may be coupled to an eighth gate terminal 398. In an exemplary embodiment, the eight gate terminal 398 may be coupled to the fourth drain terminal 347 and the fifth source terminal 327.

In an exemplary embodiment, a RF+ signal 360 may be coupled to the first drain terminal 340. In an exemplary embodiment, a RF+ signal 360 may be coupled to the third drain terminal 345. In an exemplary embodiment, a RF− signal 365 may be coupled to the second drain terminal 342. In an exemplary embodiment, a RF− signal 365 may be coupled to the fourth drain terminal 347. In an exemplary embodiment, an IF− signal 355 may be coupled to the first source terminal 320, the third source terminal 324 and a fifth source terminal 327. In an exemplary embodiment, an IF+ signal 350 may be coupled to the second source terminal 322 and a fourth source terminal 325. In an exemplary embodiment, the first source terminal 320, third source terminal 324, and fifth source terminal 327 may be coupled together. In an exemplary embodiment, the first gate terminal 380, third gate terminal 384, fifth gate terminal 392 and seventh gate terminal 396 may be coupled together. In an exemplary embodiment the second gate terminal 382, fourth gate terminal 386, sixth gate terminal 394 and eighth gate terminal 398 may be coupled together.

Figure 4:
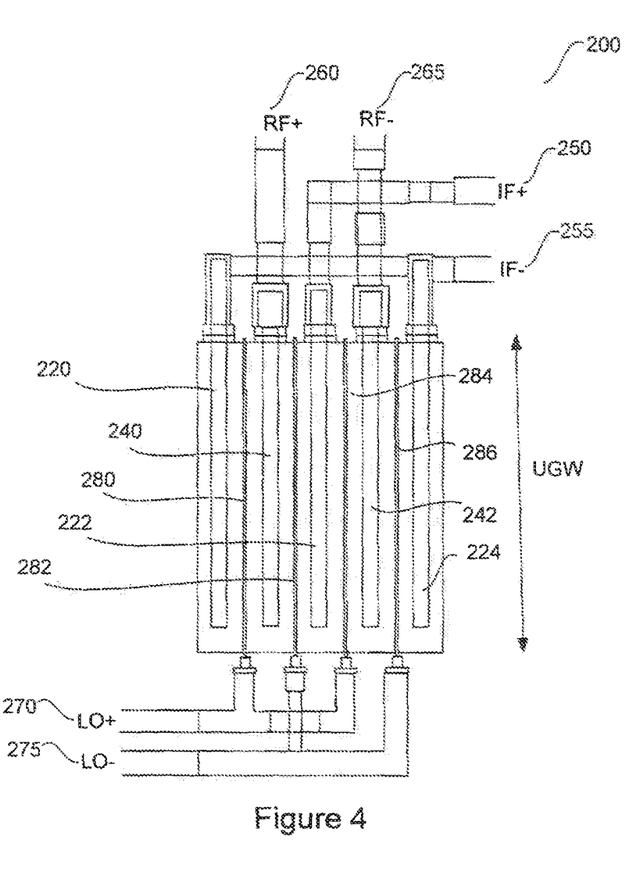
FIG. 4 illustrates a circuit layout of a MMIC based FET resistive mixer in accordance with various embodiments of the present invention.

In one exemplary embodiment and with reference to FIG. 4, a circuit layout of a MMIC based FET resistive mixer 200 in accordance with various exemplary embodiments of the present invention is provided. In this embodiment, the sharing of the plurality of three terminal semiconductor portions is depicted. FIG. 4 illustrates: a 1$^{st}$ FET comprising source 220, gate 280, and drain 240; a 2$^{nd}$ FET comprising drain 240, gate 282, and source 222; a 3$^{rd}$ FET comprising source 222, gate 284, and drain 242; and a 4$^{th}$ FET comprising drain 242, gate 286, and source 224. In this example, drain terminal 240 is the same drain terminal for the 1$^{st}$ FET and 2$^{nd}$ FET. Similarly, source terminal 222 is the same source terminal for the 2$^{nd}$ FET and the 3$^{rd}$ FET. Similarly, drain terminal 242 is the same drain terminal for the 3$^{rd}$ FET and 4$^{th}$ FET. FIG. 4 further illustrates terminals of FETs comprising a plurality of lines (e.g., for the terminals associated with the 1$^{st}$ FET, lines 220, 280, 240) extending in parallel in a first direction. Gate 280 extends in the first direction between the adjacent lines of source 220 and drain 240. Also, FIG. 4 illustrates gate 280 is coupled to gate 284. In this exemplary embodiment, there are no interconnect line lengths associated with the RF+ signal, 260, RF− signal 265 and IF+ signal 250 as all are integral to the MMIC. Similarly, in this exemplary embodiment, there are no interconnect line lengths associated with drain 240, source 222, and drain 242 as all are directly coupled to and/or integral to the MMIC. An interconnect line length (e.g. a length of about 50-100 microns, though other lengths may be used) couples source 220 and source 224. Also, shorter interconnect line lengths (e.g. a length of about 25-33 micros) of approximately equal size couple gates 286 and 282, and gates 280 and 284, respectively. In one exemplary embodiment and with reference to FIG. 4, the lack of physical separation between FETs reduces both the number of required interconnect lines and length of the interconnect lines. This reduction in interconnect line length and number of interconnect lines in the system (which further reduces the overall system interconnect line length) reduces parasitic capacitance, and the interconnect inductance of the system. In one exemplary embodiment, the reduction in parasitic capacitance and/or parasitic inductance is by at least a factor of four as compared to a conventional quad ring mixer cell. This reduction in interconnect line length and system symmetry assists with system phase cancellation, phase balance, and high frequency operation.

Also, it should be appreciated that as the system is made smaller the intrinsic parasitic capacitance, and the intrinsic interconnect inductance of the system will decrease in turn.

Figure 5A:
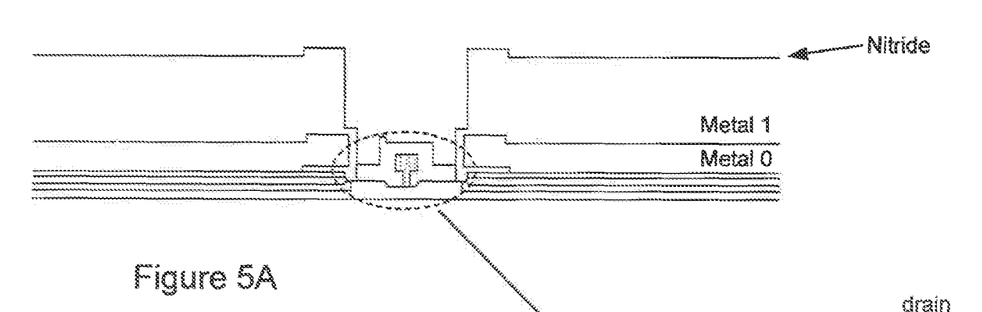
FIGS. 5A and 5B illustrate an exemplary FET substrate cross section view.
Figure 5B:
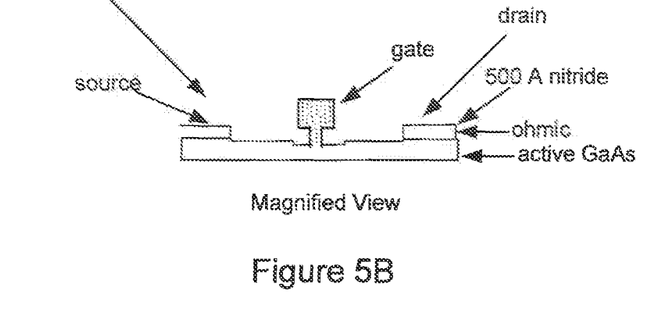

In an exemplary embodiment and with reference to FIGS. 5A and 5B, an exemplary FET cross section view is provided. FIG. 5B is a magnified view of the exemplary embodiment provided in FIG. 5A. The ohmic contact depicted in FIG. 5B may be a source or drain terminal.

Figure 6:
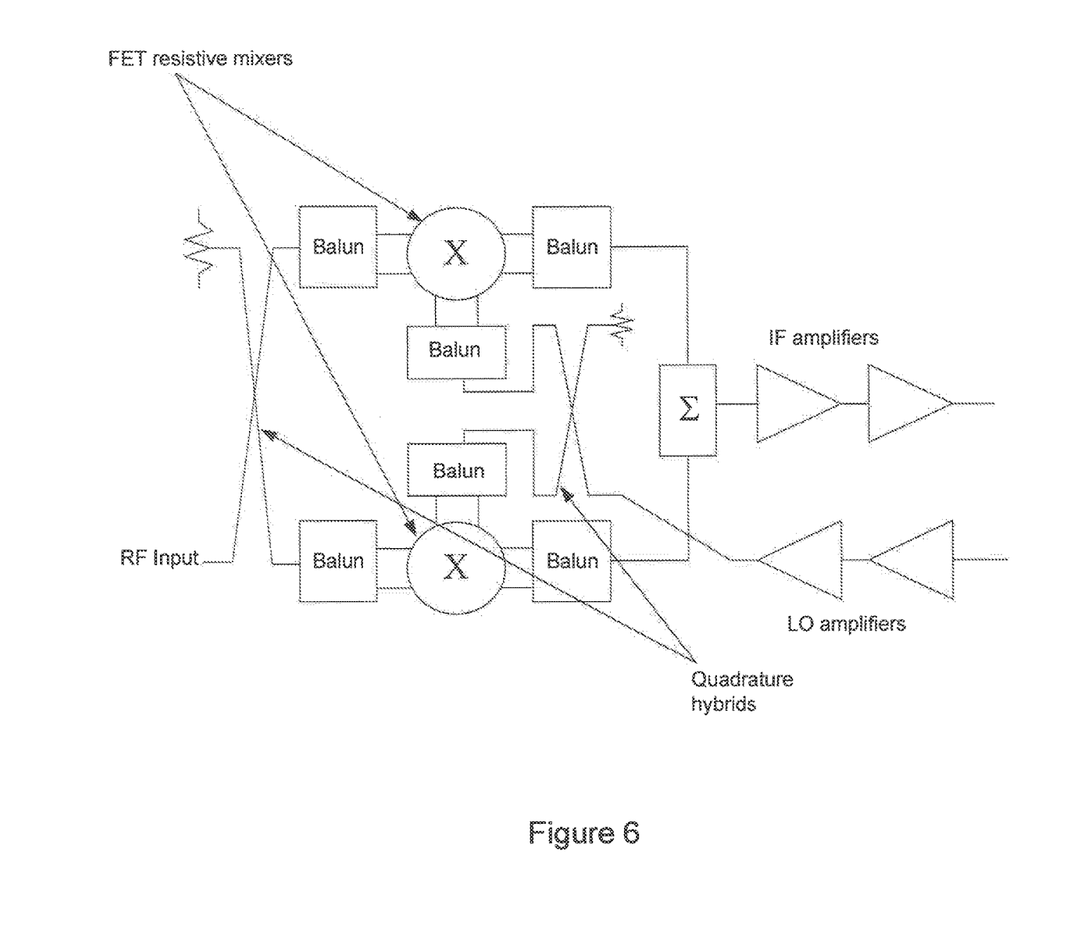
FIG. 6 illustrates an exemplary embodiment of multiple VET resistive mixers coupled together.

In another exemplary embodiment and with reference to FIG. 6, an exemplary embodiment of two FET resistive mixers coupled together is provided. In one exemplary embodiment a FET resistive mixer may be inserted in place of the two "X" portions of the FIG. 6. For instance, system 200 may be inserted in place of the two "X" portions of the FIG. 6. The block diagram elements labeled baluns in FIG. 6 may be any type of baluns (e.g. 180 degree hybrids). The exemplary embodiment depicted in FIG. 6 may be a portion of a receiver. In one exemplary embodiment, a low noise amplifier (LNA) may be coupled to the input (not depicted). In one exemplary embodiment, the quadrature hybrids may be large couplers.

In an exemplary embodiment and with reference to FIG. 6, at least a second and/or a portion of a second FET cell may be coupled to a MMIC based FET resistive mixer 200 FET cell. For instance, in the case of two MMIC based FET resistive mixer 200 FET cells coupled together the functionality of a conventional double doubly balanced mixer (e.g. triple balanced) may be replicated in a much smaller space. In an exemplary embodiment, when two MMIC based FET resistive mixer 200 FET cells are coupled together the incident power may be shared among twice as many FETs. In one exemplary embodiment, this coupling of two MMIC based FET resistive mixer 200 FET cells may provide enhanced signal handling capability.

In one exemplary embodiment, a semiconductor device includes a plurality of three terminal semiconductor portions housed on a single substrate. In this exemplary embodiment, each three terminal semiconductor portions include an emitter terminal, a collector terminal, and a base terminal. In this exemplary embodiment, a LO+ signal is coupled to a first base terminal. In this exemplary embodiment, the first base terminal is coupled to a first emitter terminal and a first collector terminal. In this exemplary embodiment, a LO+ signal is coupled to a third base terminal. In this exemplary embodiment, the third base terminal is coupled to a second emitter terminal and a second collector terminal. In this exemplary embodiment, a LO− signal is coupled to a second base terminal. In this exemplary embodiment, the second base terminal is coupled to the first collector terminal and the second emitter terminal. In this exemplary embodiment, a LO− signal is coupled to a fourth base terminal. In this exemplary embodiment, the fourth base terminal is coupled to the second collector terminal and a third emitter terminal. In this exemplary embodiment, a RF+ signal is coupled to the first collector terminal. In this exemplary embodiment, a RF− signal is coupled to the second collector terminal. In this exemplary embodiment, an IF+ signal is coupled to the first emitter terminal and the third emitter terminal. In this exemplary embodiment, an IF− signal is coupled to the second emitter terminal. In this exemplary embodiment, the first emitter terminal and the third emitter terminal are coupled together. In this exemplary embodiment, the first base terminal and the third base terminal are coupled together. In this exemplary embodiment, the second base terminal and the fourth base terminal are coupled together. In this exemplary embodiment, at least one of the emitter terminal, collector terminal and base terminal are shared among a plurality of adjacent three terminal semiconductor portions. In this exemplary embodiment, the surface area of the semiconductor device is less than approximately 0.00075 mm$^2$. In this exemplary embodiment, each three terminal semiconductor portion may comprise a BJT. In this exemplary embodiment, the substrate may be selected from the group consisting of gallium arsenide, indium phosphide or silicon.

In an exemplary embodiment, a semiconductor device includes a microwave monolithic integrated circuit based field effect transistor resistive quad ring mixer wherein the surface area of the integrated circuit is less than approximately 0.0075 mm$^2$. In an exemplary embodiment, a semiconductor device includes: a microwave monolithic integrated circuit based field effect transistor quad ring mixer comprising a first field effect transistor, a second field effect transistor, a third field effect transistor, and a fourth field effect transistor. In this exemplary embodiment, there are no wirebonds coupling the first field effect transistor, the second field effect transistor, the third field effect transistor, and the fourth field effect transistor together. In this exemplary embodiment, at least one of: a LO+ signal, LO− signal, RF+ signal, RF− signal IF+ signal, and IF− signal are coupled to at least one of: the first field effect transistor, the second field effect transistor, the third field effect transistor, and the fourth field effect transistor. In this exemplary embodiment, there are no more than 3 total interconnect line lengths. For instance, the 3 total interconnect line lengths may couple a first field effect transistor gate to a third field effect transistor gate, a second field effect transistor gate to a fourth field effect transistor gate, and a first field effect transistor source to a fourth field effect transistor source. In one exemplary embodiment, a semiconductor device includes: a microwave monolithic integrated circuit based bipolar junction transistor quad ring mixer, wherein the quad ring mixer comprises four bipolar junction transistors, wherein the quad ring mixer comprises 3 or less total interconnect line lengths from the four bipolar junction transistors. In this exemplary embodiment, the surface area of the semiconductor device is less than approximately 0.0075 mm$^2$. In this exemplary embodiment, the substrate is selected from the group consisting of gallium arsenide, indium phosphide or silicon.

It should be appreciated that the particular implementations shown and described herein are illustrative of various embodiments of the invention including its best mode, and are not intended to limit the scope of the present invention in any way. Indeed, for the sake of brevity, conventional techniques for signal processing, data transmission, signaling, and network control, and other functional aspects of the systems (and components of the individual operating components of the systems) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in a practical communication system.

The present invention has been described above with reference to exemplary embodiments. However, those skilled in the art having read this disclosure will recognize that changes and modifications may be made to the embodiments without departing from the scope of the present invention. For example, various types of transistors aside from FETs are contemplated, such as BJTs and HBTs. Also, various elements of the present system may be powered directly from a power source. Alternatively, various elements of the present system may be powered indirectly through coupled elements that receive power. These and other changes or modifications are intended to be included within the scope of the present invention, as expressed in the following claims.

The invention claimed is:

1. A mixer comprising:
 a substrate;
 a plurality of terminals arranged along a direction in the substrate in an alternating fashion, such that every other one of the plurality of terminals is a source terminal and a remaining every other one of the plurality of terminals is a drain terminal, wherein a first source terminal and a last source terminal of the plurality of terminals along the direction are coupled together via a first interconnect line; and
 a plurality of gate fingers, each of the plurality of gate fingers between corresponding adjacent terminals of the plurality of terminals, wherein the plurality of gate fingers includes a first set of gate fingers interleaved with a second set of gate fingers, the first set of gate fingers coupled together via a second interconnect line, and the second set of gate fingers coupled together via a third interconnect line.

2. The mixer of claim 1, wherein the plurality of terminals and the plurality of gate fingers define a plurality of field effect transistors, each field effect transistor of the plurality of field effect transistors sharing at least one terminal of the plurality of terminals with another field effect transistor of the plurality of field effect transistors.

3. The mixer of claim 2, wherein at least one field effect transistor of the plurality of field effect transistors shares two terminals of the plurality of terminals with other field effect transistors of the plurality of field effect transistors.

4. The mixer of claim 1, further comprising:
a first differential signal pair comprising a first signal line coupled to the second interconnect line, and a second signal line coupled to the third interconnect line;
a second differential signal pair comprising a third signal line coupled to the first interconnect line, and a fourth signal line coupled to a middle source terminal of the plurality of terminals along the direction; and
a third differential signal pair comprising a fifth signal line coupled to a first drain terminal of the plurality of terminals, and a sixth signal line coupled to a second drain terminal of the plurality of terminals.

5. The mixer of claim 1, wherein each terminal of the plurality of terminals is separated from each adjacent terminal of the plurality terminals by a gate width of the plurality of gate fingers.

6. The mixer of claim 1, wherein each drain terminal of the plurality of terminals is between a corresponding pair of adjacent source terminals of the plurality of terminals.

7. The mixer of claim 1, wherein each pair of adjacent source terminals of the plurality of terminals is separated by a single drain terminal of the plurality of terminals.

8. The mixer of claim 1, wherein each of the plurality of terminals has the same width perpendicular to the direction.

9. The mixer of claim 1, further comprising an RF differential signal pair comprising a first RF signal line coupled to a first drain terminal of the plurality of terminals, and a second RF signal line coupled to a second drain terminal of the plurality of terminals.

10. The mixer of claim 9, wherein the first drain terminal and the second drain terminal are symmetrically arranged on opposing sides of one source terminal of the plurality of terminals.

11. The mixer of claim 10, further comprising a first IF signal line coupled to the one source terminal.

12. The mixer of claim 11, further comprising a second IF signal line coupled to the first interconnect line, wherein the first IF signal line and the second IF signal line define an IF differential signal pair.

13. The mixer of claim 1, wherein:
the first interconnect line is on a first side of the plurality of terminals; and
the second and third interconnect lines are on a second side of the plurality of terminals opposite the first side.

14. The mixer of claim 1, wherein the plurality of terminals are coupled to a plurality of signal lines, each of the plurality of signal lines coupled to a first side of the plurality of terminals.

15. The mixer of claim 1, wherein the first interconnect line is further coupled to a middle source terminal of the plurality of terminals along the direction.

16. The mixer of claim 15, further comprising a fourth interconnect line coupled to a second source terminal and a second-to-last source terminal of the plurality of terminals along the direction.

17. The mixer of claim 16, wherein the fourth interconnect line is further coupled to a first IF signal line.

18. The mixer of claim 16, further comprising:
a fifth interconnect line coupled to a first pair of drain terminals of the plurality of terminals; and
a sixth interconnect line coupled to a second pair of drain terminals of the plurality of terminals.

19. The mixer of claim 18, further comprising:
a first RF signal line coupled to the fifth interconnect line; and
a second RF signal line coupled to the sixth interconnect line.

* * * * *